United States Patent [19]

Capasso et al.

[11] Patent Number: 4,999,697
[45] Date of Patent: Mar. 12, 1991

[54] SEQUENTIAL-QUENCHING RESONANT-TUNNELING TRANSISTOR

[75] Inventors: Federico Capasso, Westfield; Alfred Y. Cho, Summit; Susanta Sen, Scotch Plains, all of N.J.

[73] Assignee: AT&T Bell Laboratories, Murray Hill, N.J.

[21] Appl. No.: 244,753

[22] Filed: Sep. 14, 1988

[51] Int. Cl.$^5$ .................................. H01L 29/72
[52] U.S. Cl. ........................... 357/34; 357/16; 357/4 SL; 357/57; 357/58; 357/34 HB
[58] Field of Search .............. 357/34, 16, 12, 58, 357/57, 4 SL, 34 HB

[56] References Cited

U.S. PATENT DOCUMENTS

| | | | |
|---|---|---|---|
| 4,712,121 | 12/1987 | Yokoyama | 357/4 |
| 4,797,722 | 1/1989 | Shannon | 357/16 |
| 4,825,264 | 4/1989 | Inata et al. | 357/34 |
| 4,845,541 | 7/1989 | Xu et al. | 357/4 |
| 4,849,799 | 7/1989 | Capasso et al. | 357/16 |
| 4,868,418 | 9/1989 | Imamura et al. | 357/16 |
| 4,907,196 | 3/1990 | Mori et al. | 357/16 |
| 4,912,539 | 3/1990 | Haddad et al. | 357/4 |

FOREIGN PATENT DOCUMENTS

| | | | |
|---|---|---|---|
| 0216361 | 9/1987 | Japan | 357/16 |
| 0293783 | 12/1987 | Japan | 357/12 |

OTHER PUBLICATIONS

Capasso et al., "Multiple Negative Transconductance and . . . of Resonant Tunneling", Appl. Phys. Lett. 53(12), 9/19/1988.
Levine et al., "InGaAs/InAlAs . . . at a Wavelength of $\lambda=4.4$ $\mu$m" Appl. Phys. Lett. 52 (18), 5/2/88.
Chen et al., "Enhanced Ballistic Transport in InGaAs-/InAlAs Hot-Electron Transistors", Appl. Phys. Lett. 51 (16), 10/19/87.
"Combining Resonant Tunneling Diodes for Signal Processing and Multilevel Logic", A. A. Lakhani et al., Applied Physics Letters, vol. 52 (1988), pp. 1684–1685.
"Eleven-Bit Parity Generator with a Single, Vertically Integrated Resonant Tunneling Device", A. A. Lakhani et al., Electronics Letters, vol. 24 (1988), pp. 681-683.
"Three-Dimensional Integration of Resonant Tunneling Structures for Signal Processing and Three-State Logic", R. C. Potter et al., Applied Physics Letters, vol. 52 (1988), pp. 2163-2164.
"New Resonant-Tunneling Devices with Multiple Negative Resistance Regions and High Room-Temperature Peak-to-Valley Ratio", S. Sen et al., IEEE Electron Device Letters, vol. 9, (1988), pp. 402-404.
"A New Functional Resonant-Tunneling Hot Electron Transistor (RHET)", N. Yokohama et al., Japanese Journal of Applied Physics, vol. 24 (1985), pp. L853-L854.
"Quantum-Well Resonant Tunneling Bipolar Transistor Operating at Room Temperature", F. Capasso et al., IEEE Electron Device Letters, vol. EDL-7 (1986), pp. 573-576.
"Resonant Tunneling Gate Field-Effect Transistor", F. Capasso et al., Electronics Letters, vol. 23 (1987), pp. 225-226.

Primary Examiner—Rolf Hille
Assistant Examiner—Tran T. Minh Loan
Attorney, Agent, or Firm—G. E. Books

[57] ABSTRACT

A plurality of decoupled quantum wells in a transistor device enables such device to operate with multiple-peak characteristics. The device is suitable for a variety of circuit applications in switching systems and in central processor logic units and memories; specific applications include frequency multipliers, waveform scramblers, parity-bit generators, analog-to digital converters, and multiple-valued logic units.

9 Claims, 9 Drawing Sheets

4,999,697

SEQUENTIAL-QUENCHING RESONANT-TUNNELING TRANSISTOR

TECHNICAL FIELD

The invention is concerned with resonant-tunneling semiconductor devices as characterized by device operation involving carrier energy coinciding with a quantized energy level in a potential well.

BACKGROUND OF THE INVENTION

The development of resonant-tunneling semiconductor devices has been motivated largely by the desire for increased miniaturization, functional density, and operating speed in electronic devices as designed for use in a variety of digital and analog circuits. Among proposed devices are two-terminal devices as disclosed, e.g., by A. A. Lakhani et al. "Combining Resonant Tunneling Diodes for Signal Processing and Multilevel Logic", *Applied Physics Letters*, VOl. 52 (1988), pp. 1684–1685;

A. A. Lakhani et al, "Eleven-bit Parity Generator with a Single, Vertically Integrated Resonant Tunneling Device", *Electronics Letters*, Vol. 24 (1988), pp. 681–683;

R. C. Potter et al, "Three-dimensional Integration of Resonant Tunneling Structures for Signal Processing and Three-state Logic", *Applied Physics Letters*, Vol. 52 (1988), pp. 2163–2164; and S. Sen et al., "New Resonant-Tunneling Devices with Multiple Negative Resistance Regions and High Room-Temperature Peak-to-Valley Ratio", *IEEE Electron Device Letters*, Vol. 9 (1988), pp. 402–404.

Proposed also are three-terminal devices as disclosed, e.g., by Electron Transistor (RHET)", *Japanese Journal of Applied Physics*, Vol. 24 (1985), pp. L853–L854;

F. Capasso et al., "Quantum-Well Resonant Tunneling Bipolar Transistor Operating at Room Temperature", *IEEE Electron Device Letters, Vol. EDL*-7 (1986), pp. 574–576;

F. Capasso et al, "Resonant Tunneling Gate Field-Effect Transistor", *Electronics Letters*, Vol. 23 (19878), pp. 225–226; and in U.S. Pat. No. 4,712,121, "High-Speed Semiconductor Device", issued Dec. 8, 1987 to N. Yokoyama.

While such disclosed three-terminal resonant-tunneling devices have single-peak current-voltage characteristics, the invention as described below is motivated by the desire for a transistor having multiple-peak characteristics.

SUMMARY OF THE INVENTION

A semiconductor device is provided for incorporation, e.g., in switching systems, central processor logic units, memories, frequency multipliers, waveform scramblers, parity-bit generators, and analog-to-digital converters, such device being capable, under suitable operating conditions, a plurality of negative-resistance regions with equal or nearly equal peak currents. The device is a heterostructure bipolar device comprising emitter, base, and collector regions and contacts, the region between the collector region and the contact to the emitter region comprising at least two quantum-well structures. These structures are such that there is no significant quantum-mechanical interaction between their quantum-mechanical states, and such that, during device operation, quenching of resonant tunneling through these quantum wells occurs at different base-emitter voltages.

DETAILED DESCRIPTION

Figure 1:
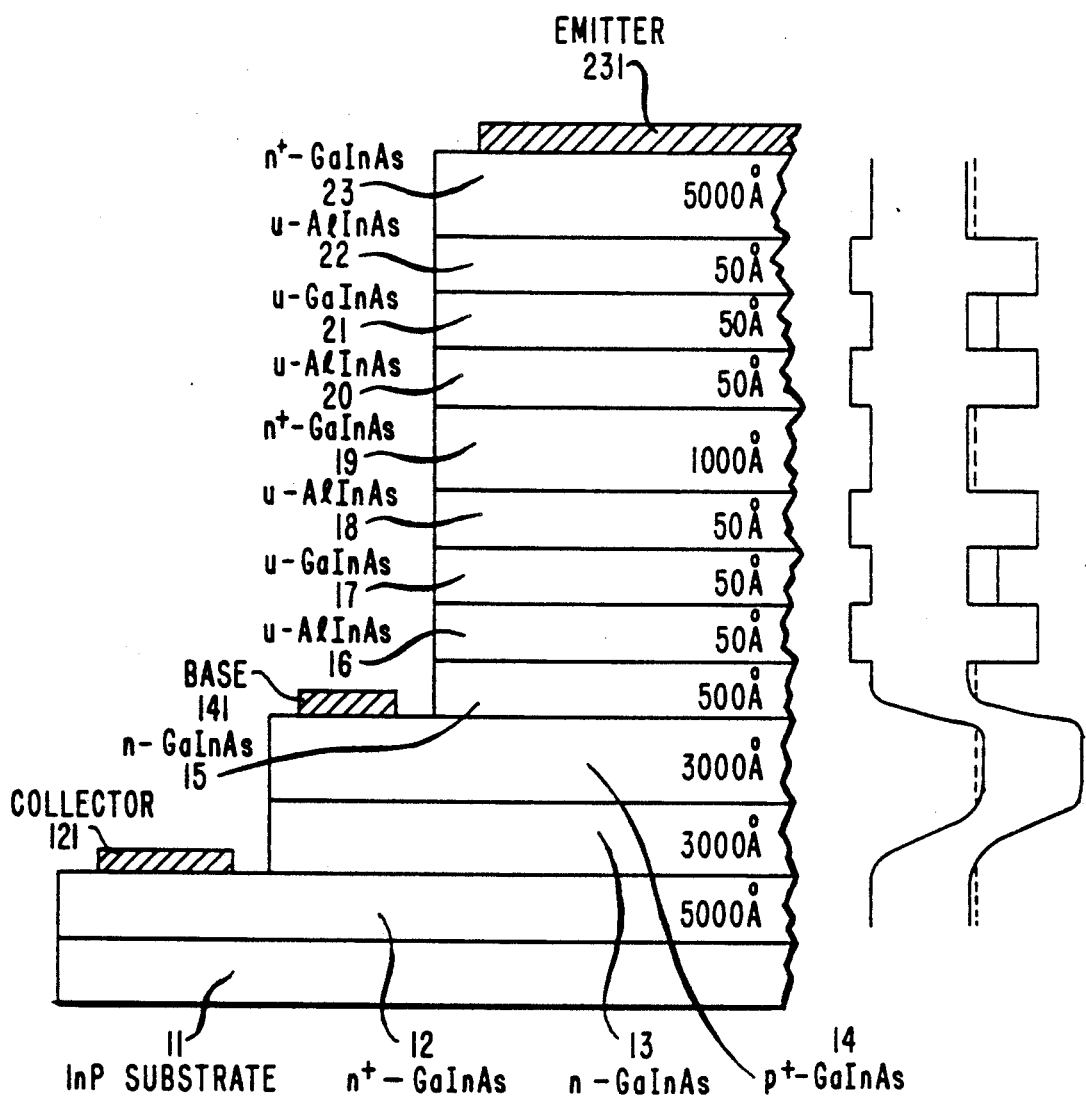
FIG. 1 is a schematic and greatly enlarged view of an exemplary preferred device structure of the invention and, alongside which structure, a corresponding zero-bias band diagram.

Exemplary preferred device structure shown in FIG. 1 represents an n-p-n bipolar transistor with two resonant-tunneling double-barrier quantum wells in series in the emitter. Such structure can be made by well-established techniques such as, e.g., molecular-beam epitaxy (MBE) or metal-organic chemical vapor deposition (MOCVD), e.g. on an indium phosphide substrate 11 which may be doped or undoped, the latter being preferred in the interest of enhanced device operating speed. Successively deposited lattice-matched layers 12 through 23 have nominal composition $Ga_{0.47}In_{0.53}As$ in the case of gallium-indium arsenide, and $Al_{0.48}In_{0.52}As$ in the case of aluminum-indium arsenide. Preferred dopant concentrations are greater than or approximately $2 \times 10^{18}/cm^3$ for collector-contact layer 12, less than or approximately $2 \times 10^{16}/cm^3$ for collector-active layer 13, greater than or approximately $2 \times 10^{18}/cm^3$ for base layer 14, approximately $1 \times 10^{18}/cm^3$ for layer 15, approximately $5 \times 10^{17}/cm^3$ for quantum-well separating layer 19, and greater than or approximately $1 \times 10^{18}/cm^3$ for emitter-contact layer 23. As can be seen from the band diagram alongside the device structure, layers 16, 17, and 18, and layers 20, 21 and 22 form double-barrier resonant-tunneling quantum wells.

Not shown in FIG. 1 are 50-Angstrom nominally undoped gallium-indium arsenide offset layers which are preferably included, in the interest of inhibiting dopant diffusion into the barrier layers during high-temperature growth processing, between layers 15 and 16, 18 and 19, 19 and 20, and 22 and 23.

Photolithography and chemical wet etching were used to produce an emitter means having a diameter of approximately 50 micrometers and a base mesa having a diameter of approximately 125 micrometers; the nominal composition of the etchant was $50H_2O + 3H_3PO_4 + 1H_2O_2$. Emitter and collector contact metallizations 231 and 121 were made by successively evaporating germanium, gold, silver, and gold; the base contact layer 141 was made by evaporating gold-beryllium alloy and then gold. The contacts were alloyed at a temperature of approximately 375 degrees C. for approximately 10 seconds in a hydrogen atmosphere so as to prevent oxidation. (Oxidation may be prevented also by the use of an inert atmosphere, e.g., of nitrogen or helium.)

While the device structure as described above corresponding to an n-p-n resonant-tunneling bipolar transistor (RTBT), p-n-p structure is not precluded. And while, in the former case, double-barrier quantum-well structures as called for in accordance with the invention are in the conduction band, in the latter case such structures are in the valence band. In all cases the number of quantum wells present is a plurality of 2 or more, such plurality comprising at least two quantum wells such that, during device operation, quenching of resonant tunneling through these two quantum wells occurs at different base-emitter voltages. The two quantum wells are separated such that there is no significant quantum-mechanical interaction between the quantum-mechanical states of the two quantum wells, separation typically resulting from the presence of a sufficiently thick, low-bandgap doped layer between quantum wells. Preferred thickness of such separating layer is greater than the thermal de Broglie wavelength of the layer material as defined by $\lambda = h/(3kTm^*)^{\frac{1}{2}}$, where T denotes the lattice temperature, and $m^*$ the effective mass of tunneling (majority) carriers. Such lower limit on layer thickness is in the interest of precluding the presence of quantum state in the separating layer which are coupled to the quantum states of the quantum wells. In the case of gallium-indium arsenide, preferred separating layer thickness is in the range from 500 to 1000 Angstroms for room-temperature operation. Preferred doping of the separating layer is at least $2 \times 10^{17}/cm^3$.

Preferred placement of quantum wells is between the base region and the contact to the emitter region; preferred also is the inclusion, adjacent to the base region, of a region having doping type opposite to the doping type of the base region, and having a bandgap which is wider than the bandgap of the base region (see layer 15 in FIG. 1); inclusion of such preferred region serves to inhibit back-injection of minority carriers from the base region during device operation. Conveniently, the interest of bandgap matching, such region has graded composition towards the quantum wells.

While the device of FIG. 1 has been described in terms of preferred gallium-indium arsenide and aluminum-indium arsenide materials, other material compositions are not precluded. For example, barrier layers may be made of aluminum-gallium arsenide or aluminum arsenide, and well layers of gallium arsenide or (strained) gallium-indium arsenide, $Ga_{1-x}In_xAs$, $0 \leq x \leq 0.2$. Also, $Ga_{0.47}In_{0.53}As$ well layers can be combined with aluminum-indium arsenide, indium phosphide, or (strained) aluminum arsenide layers.

Figure 2:
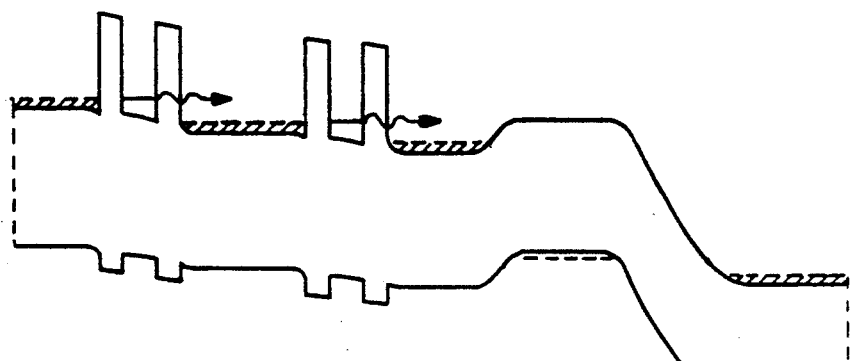
FIG. 2, 3, and 4 are common-base band diagrams as corresponding to the device of FIG. 1 at fixed collector voltage and successively higher emitter voltage magnitudes.
Figure 3:
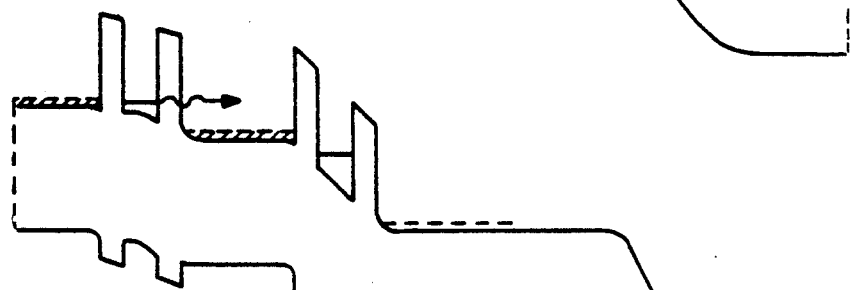
Figure 4:
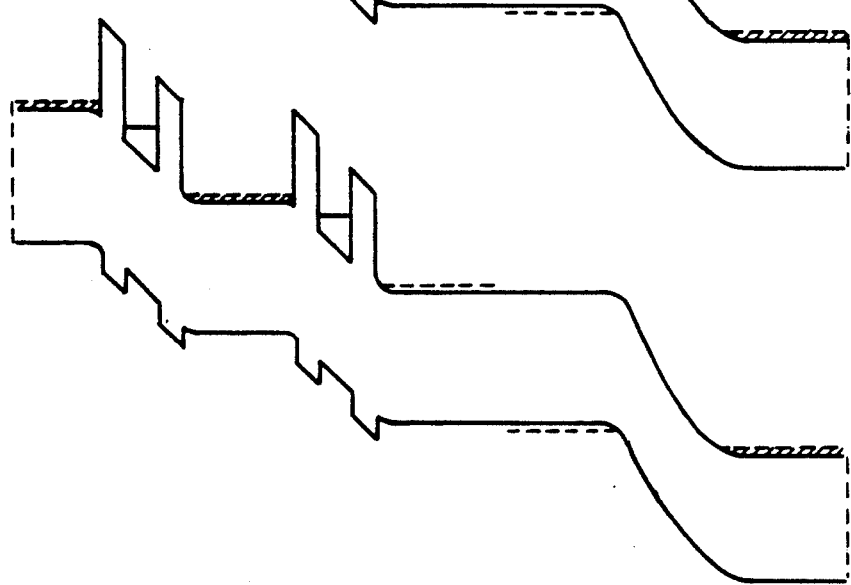

Device functioning as described below with reference to FIG. 2 to 4 may be understood as based on the sequential quenching of resonant tunneling through two (or more) double-barrier quantum wells as caused by nonuniform electrical field distribution across the quantum wells due to charge build-up. If the collector bias is kept fixed then, for (negative) emitter-base voltages $V_{EB}$ less in magnitude than the built-in voltage of the gallium-indium arsenide p-n junction, most of the bias voltage falls across this junction because its impedance is considerably greater than the impedance of the two quantum wells in series, both of which are conducting via resonant tunneling (as indicated by arrows in FIG. 2). If the magnitude of $V_{EB}$ is increased further to equal the built-in voltage, the junction reaches a flat-band configuration and becomes strongly conducting. Any additional increase in the magnitude of $V_{EB}$ will then fall -primarily across the quantum wells (see FIG. 3), such sells being designed so that the ground state in the quantum well is significantly above the Fermi level in the adjacent cladding layers. The electric field across the quantum wells is nonuniform and highest at the aluminum-indium arsenide barrier adjacent to the n-region of the p-n junction (i.e., closest to the base layer) as due to the screening of the field by the charge accumulated in the wells during resonant tunneling. If $V_{EB}$ is increased further still, resonant tunneling is quenched across the quantum well closest to the indium-gallium arsenide p-n junction, and this process repeats itself for each quantum well in sequence. Once resonant tunneling has been quenched across a quantum well, the voltage drop across such quantum well increased rapidly with increased bias voltage due to increased resistance. The nonresonant tunneling component (i.e., thermionic emission and inelastic tunneling) through the quantum well is large enough to provide continuity for the resonant-tunneling current flowing through the other quantum well(s). Every time resonant tunneling through a quantum well is quenched there is a drop in the electron current injected from the emitter to the base and an attendant drop in the collector current. Thus, a negative transconductance region is obtained in the collector current as a function of $V_{EB}$, corresponding to the quenching of resonant tunneling through each quantum well. With N quantum wells there will be N peaks in the transfer characteristics.

Figure 5:
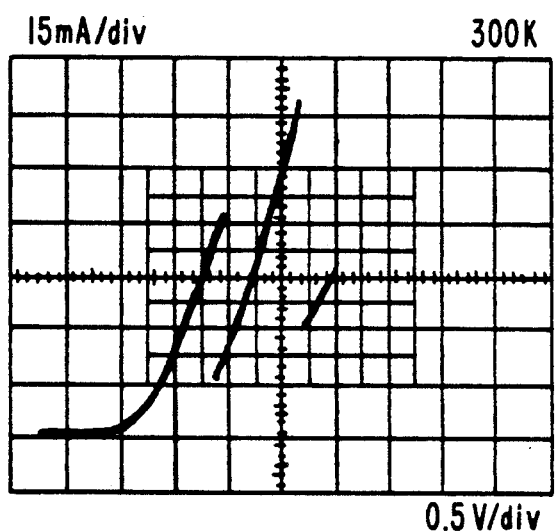
FIG. 5 and 6 are common-base transfer-characteristics diagrams as corresponding to the device of FIG. 1 and as obtained, respectively, at the temperature of liquid nitrogen and at room temperature.
Figure 6:
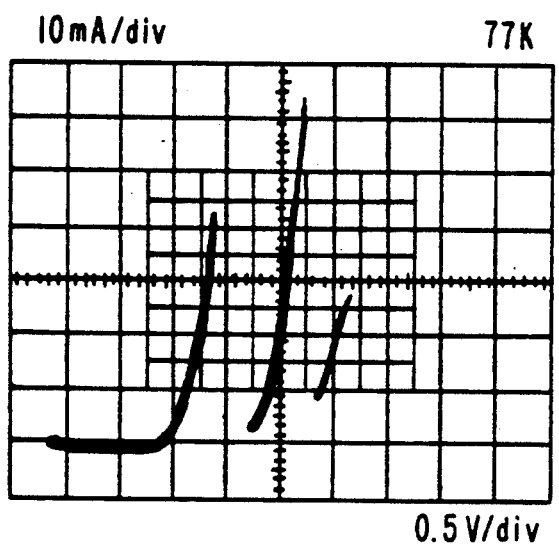

In the case of the device of FIG. 1, and as shown in FIG. 5 (corresponding to room-temperature operation) and FIG. 6 (corresponding to operation at a temperature of approximately 77 K), two peaks are observed in the current-voltage characteristics (collector current versus $V_{EB}$ at a fixed collector-base voltage $V_{CB}=0.1$ V). For $V_{EB}$ greater in magnitude than the built-in voltage of approximately 0.7 V., the p-n junction begins to conduct strongly and the collector current increases rapidly until resonant tunneling through the first quantum well is quenches. This sequence repeats itself for the second quantum well, thus giving rise to a second peak. The peak-to-valley ratio for the first peak is approximately 4:1 at 300 K, and 3:1 for the second peak. At liquid-nitrogen temperature the corresponding ratios are 22:1 and 8:1. The current-voltage characteristics were found to be essentially the same for different values of the collector-base voltage $V_{CB}$.

Figure 7:
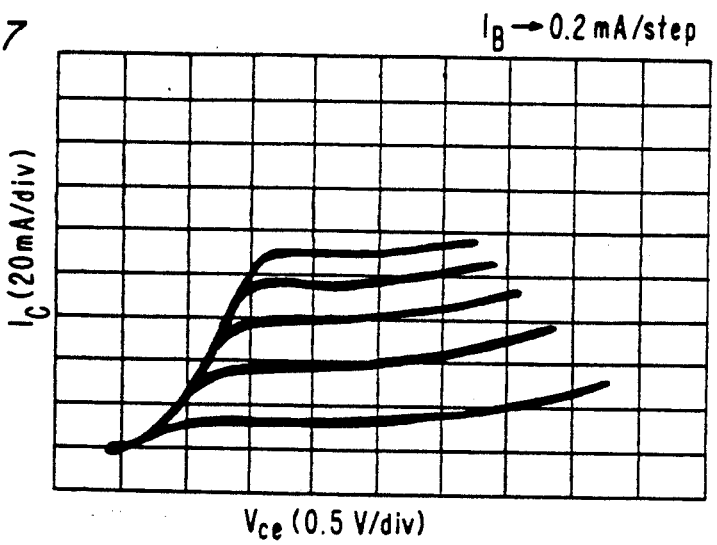
FIG. 7, 8, and 9 are common-emitter output-characteristics diagrams as corresponding to the device of FIG. 1 and as obtained, respectively, at the temperature of liquid nitrogen and at room temperature.
Figure 8:
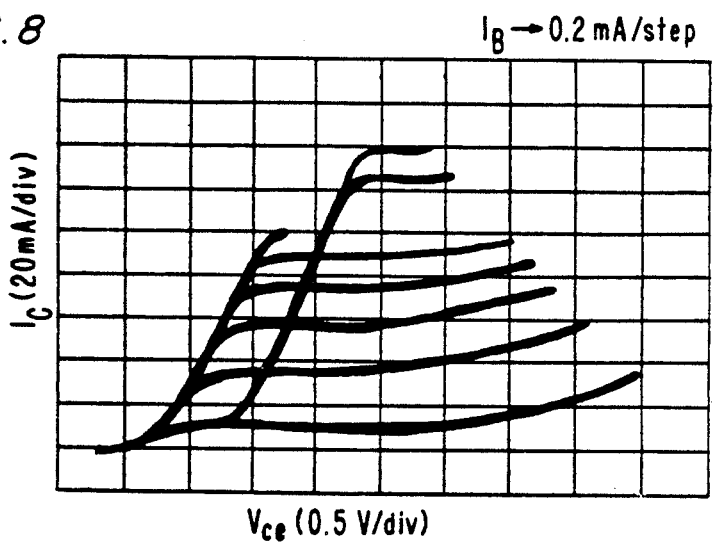
Figure 9:
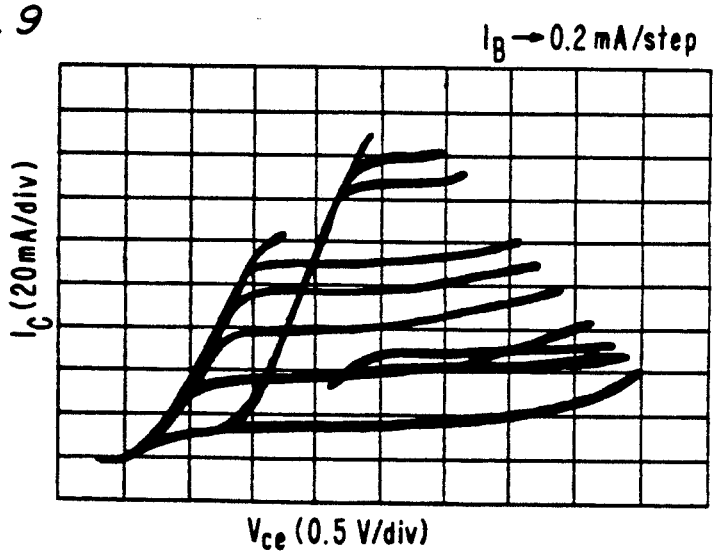

Common-emitter output characteristics of the device of FIG. 1 at room temperature are shown in FIG. 7 for base current $I_B$ up to 1 mA, in FIG. 8 for $I_B$ up to 1.4 mA. and in FIG. 9 for $I_B$ up to 1.8 mA. At low values of $I_B$ (low $V_{BE}$), the applied base-emitter voltage drops mainly across the p-n junction until flat-band condition is reached, the device behaving like a conventional bipolar transistor with a small-signal current gain as high as 70; see FIG. 7. FIG. 8 shows quenching of current gain at $I_B=1.2$ mA, with a peak-to-valley ratio of about 6:1. As $I_B$ ($V_{BE}$) is increased further, a second negative-differential-resistance region is produced in the collector current versus $V_{CE}$ characteristic at $I_B=1.6$ mA, associated with quenching of resonant tunneling across the other quantum well; see FIG. 9.

Figure 10:
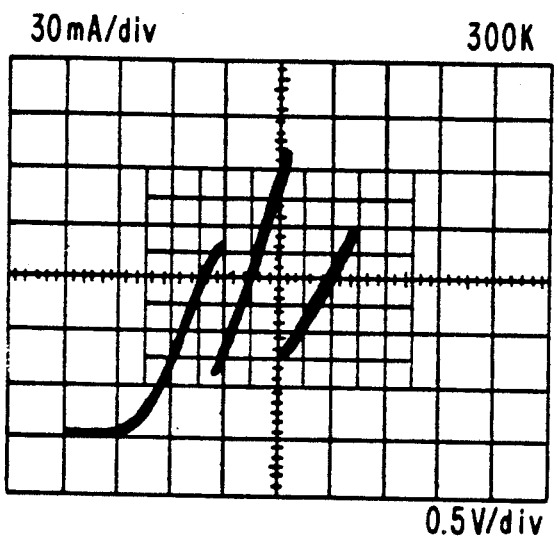
FIG. 10 and 11 are common-emitter transfer characteristics diagrams as corresponding to the device of FIG. 1 and as obtained, respectively, at the temperature of liquid nitrogen and at room temperature.
Figure 11:
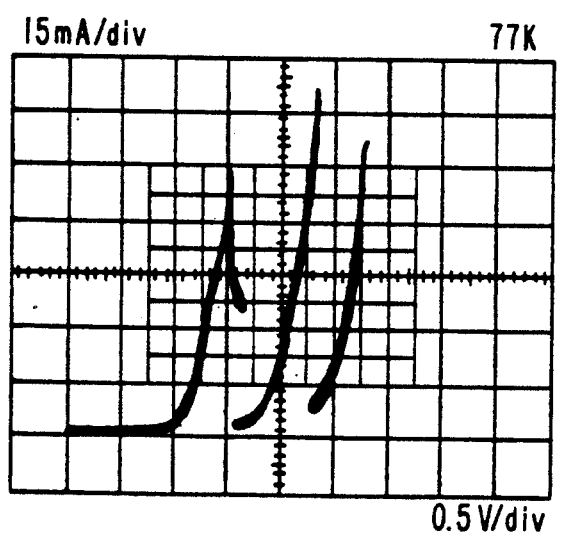

FIG. 10 and 11 show common-emitter transfer characteristic, $I_C$ versus $V_{BE}$, at constant $V_{CE}=2.5$ V at respective temperature of 300 K and 77 K. At constant $V_{CE}$, as $V_{BE}$ increases, the emitter and collector currents increase until the emitter-base junction reaches flat-band condition. Beyond flat-band condition, at higher $V_{BE}$, resonant tunneling through the two quantum wells quenches sequentially, and sharp drops in the emitter and collector currents are observed. The highest peak-to-valley ratio in the transfer characteristics is 4:1 at room temperature, and about 20:1 at 77 k. The current-voltage characteristics were found to be essentially the same for different values of the collector-base voltage $V_{CE}$.

Devices of the invention can be used in a variety of circuits as implemented, typically, in the form of integrated circuits. Based on transfer characteristics as shown in FIG. 10 and 11, a frequency multiplier circuit can be designed according to FIG. 12 (For the sake of specificity and convenience, the following feasible values are provided with reference to FIG. 12: $V_{CC}=3.0$ V, $V_{BB}=1.8$ V, $R_C=5\Omega$, and $R_B=50\Omega$.)

Figure 12:
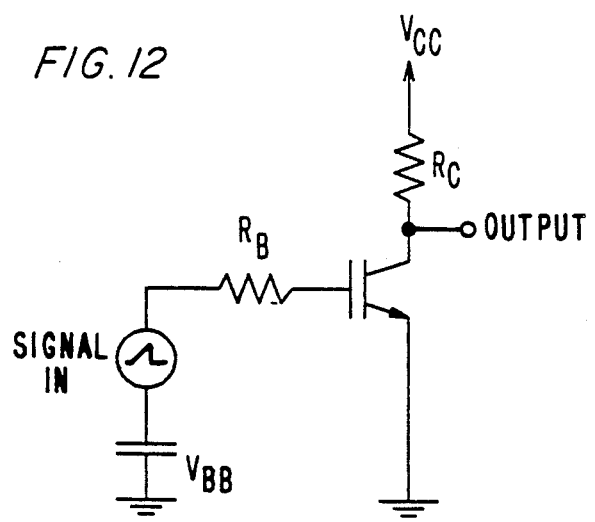
FIG. 12 is a circuit diagram of a frequency multiplier incorporating the device of FIG. 1.
Figure 13:
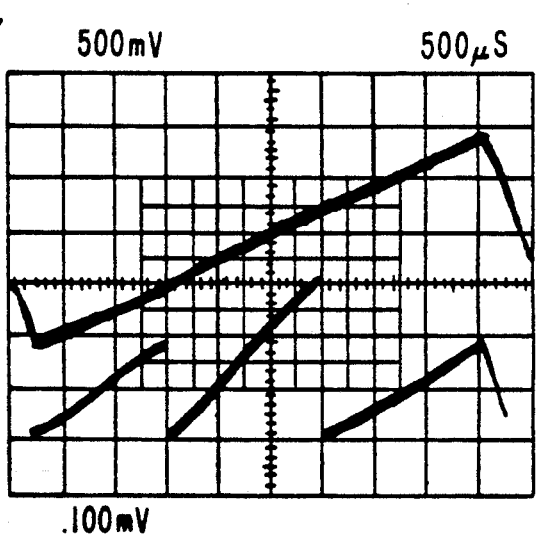
FIG. 13 is a diagram of a triangular input waveform to the circuit of FIG. 12 and of the corresponding frequency-multiplied output waveform which, for the sake of clarity, has been inverted in phase.
Figure 14:
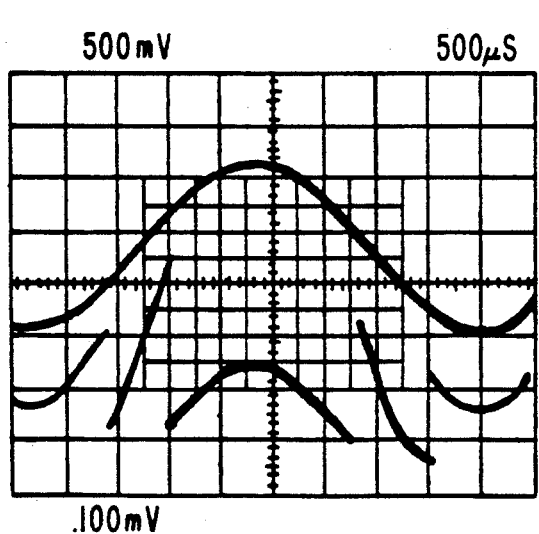
FIG. 14 is a diagram of a sinusoidal input waveform to the circuit of FIG. 12 and of the corresponding frequency-multiplied output waveform which, for the sake of clarity, has been inverted in phase.

In frequency-multiplier circuit operation, as the input voltage is increased the collector current increases and the collector voltage decreases until the device reaches the negative transconductance regions, where a sudden drop in the collector current and an increase in the output voltage are observed. Thus, under suitable bias ($V_{BB}$), triangular input waves are multiplied by a factor of three (see FIG. 13), and sine waves by a factor of five (see FIG. 14). (For the sake of clarity, output waveforms in FIG. 13 and 14 are shown inverted in phase.) Among specific advantages of the circuit of FIG. 12 is the fact that the output signal is ground-referenced and isolated from the input—as due to multiple peaks in the transfer characteristics of a transistor. Under suitable operating conditions, the circuit of FIG. 12 can alternatively serve for waveform scrambling.

Figure 15:
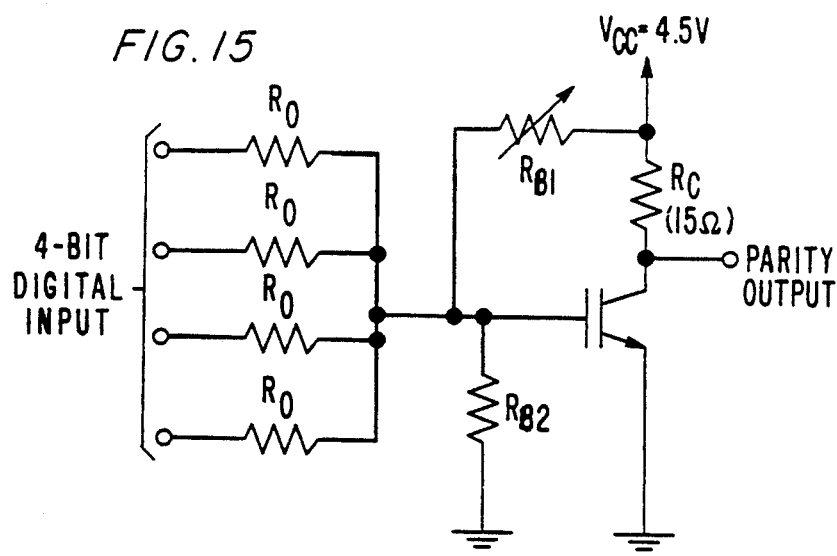
FIG. 15 is a diagram of parity generator incorporating the device of FIG. 1.

FIG. 15 shows a circuit for parity-bit generation whose operation involves adding up four input bits at the base node of the transistor by the resistive network to generate a stepped waveform. The quiescent bias of the transistor, adjusted by the resistance $R_{B1}$, and the values of the resistance $R_0$ are chosen to select the operating points of the transistor alternately as low and high collector current levels at the successive steps of the summed voltage. Thus, the output voltage at the collector will be high or low depending on whether the number of input bits set high is even or odd, respectively. While 24 ordinary transistors are needed in an optimized conventional parity-bit circuit using three exclusive OR's, the circuit according to FIG. 15 performs the same function with a single transistor of the invention. Moreover, while conventional parity generators operate by hierarchically comparing two input bits at a time, in the present circuit all input bits are handled simultaneously, and this results in higher operating speed.

Figure 16:
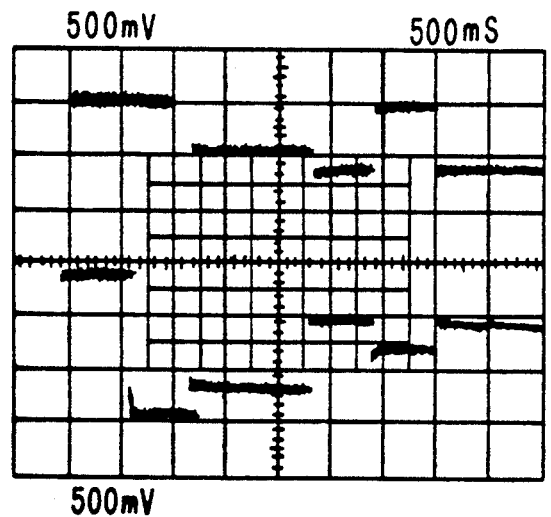
FIG. 16 and 17 are diagrams of base and collector waveforms in the circuit of FIG. 15 as operating, respectively, at the temperature of liquid nitrogen and at room temperature.
Figure 17:
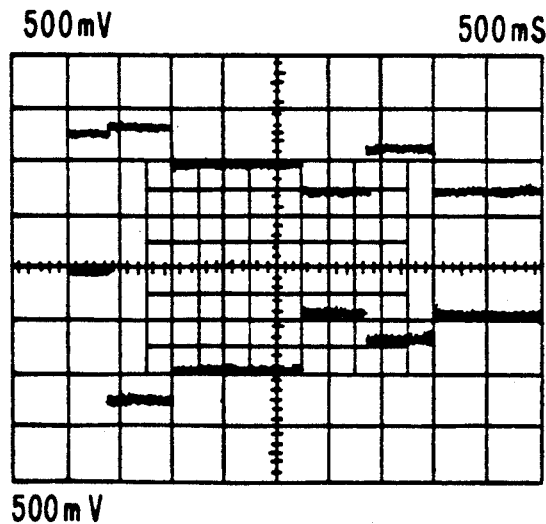

The circuit of FIG. 15 was tested by means of pseudo-random 4-bit words. Experimental results are shown in FIG. 16 (77 K) and FIG. 17 (room temperature), the top and bottom traces respectively representing the collector output and the base waveforms.

Figure 18:
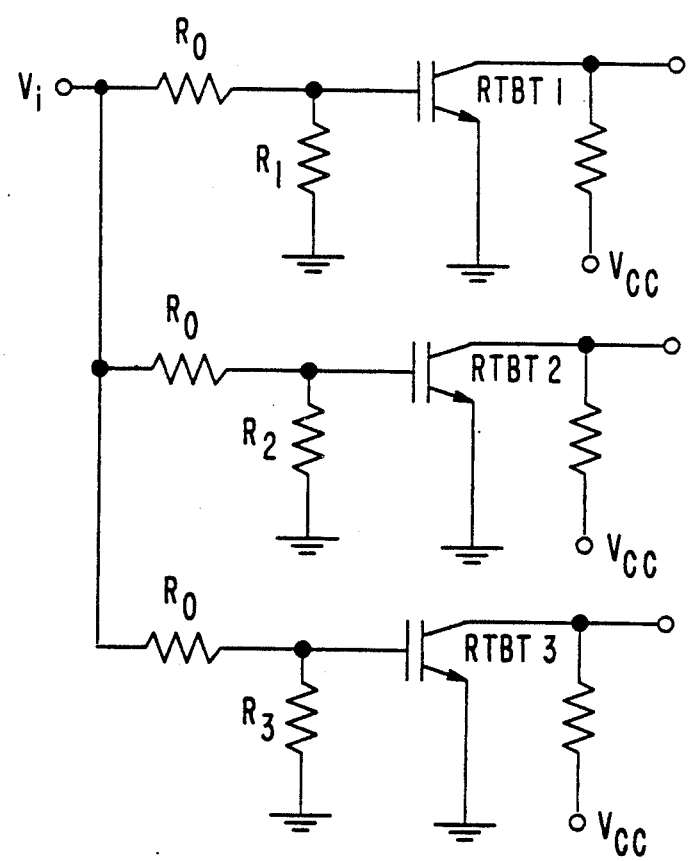
FIG. 18 is a diagram of analog-to-digital converter incorporating three devices in accordance with FIG. 1.

FIG. 18 shows three devices of the invention combined to form an analog-to-digital converter. In this application, the analog input $V_i$ is applied simultaneously to a parallel array of resonant-tunneling transistors through a plurality of voltage-scaling networks, namely, $R_0$ and $R_1$, $R_0$ and $R_2$, and $R_0$ and $R_3$ to RTBT1, RTBT2, and RTBT3, respectively. Thus an interlaced pattern of harmonically related transfer characteristics is produced. The outputs from the array from a binary code which represents the quantized analog input level.

Figure 19:
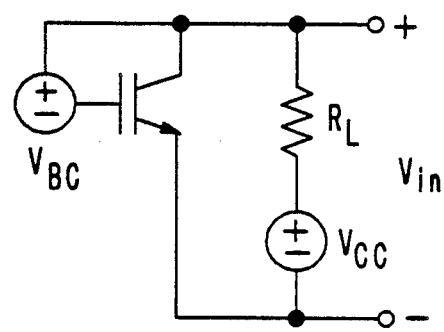
FIG. 19 is a diagram of multi-values logic circuit incorporating a device in accordance with FIG. 1; an FIG. 20 is a current-voltage characteristic diagram as related to the operation of the circuit of FIG. 19.
Figure 20:
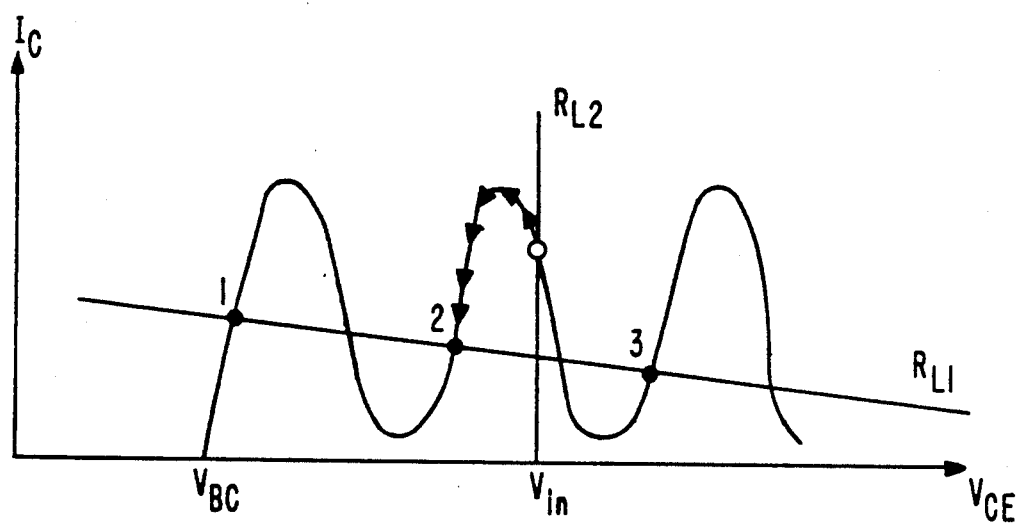

FIG. 19 shows a multiple-valued logic (or multiple-state memory) circuit as based on multiple-valued negative differential resistance characteristics at the emitter-collector terminals or a RTBT when the base-collector junction is held at fixed bias $V_{BC}$. Variations in $V_{CE}$ then cause variations in $V_{EB}$, causing the collector current to peak as $V_{EB}$ crosses a tunneling resonance; see FIG. 20. When connected to a resistive load $R_L$ and voltage supply $V_{CC}$, the resulting load line intersects the current-voltage characteristic at N stable points, where N is the number of resonant peaks. Thus, the circuit acts as an N-state memory element which can provide high-density data storage. The element can be latched onto any one of the stable states by momentarily applying a voltage close to the desired state.

We claim:
1. A semiconductor device comprising:
   an emitter region having a first conductivity type and a first composition and bandgap profile;
   a base region having a second conductivity type and a second composition and bandgap profile;
   a collector region having said first conductivity type and having a third composition and bandgap profile;
   first, second, and third electrical contacts to said emitter, base and collector regions, respectively:
   a plurality of quantum wells between said base region and said electrical contact to said emitter region,
   at least two of said quantum wells being separated such that there is no significant quantum-mechanical interaction between the quantum-mechanical states of two quantum wells, and such that, during intended device operation, quenching of resonant tunneling through said quantum wells occurs at different base-emitter voltages; and
   means for inhibiting back-injection of minority carriers from said base region to said emitter region during device operation.
2. The device of claim 1 wherein said means for inhibiting back-injection region comprises a region adjacent to said base region having doping type opposite to the doping type of said base region a bandgap which is wider than the bandgap of said base region.
3. An electrical circuit comprising a semiconductor device according to claim 1.

4. A frequency-multiplication circuit comprising a device according to claim 1.

5. A waveform scramble circuit comprising a device according to claim 1.

6. A parity-bit generator circuit comprising a device according to claim 1.

7. An analog-to-digital conversion circuit comprising a device according to claim 1.

8. A multiple-valued logical processing circuit comprising a device according to claim 1.

9. A memory circuit comprising a device according to claim 1.

* * * * *